(12) United States Patent
Dutton et al.

(10) Patent No.: US 7,812,307 B2
(45) Date of Patent: Oct. 12, 2010

(54) MICROPLASMA-BASED SAMPLE IONIZING DEVICE AND METHODS OF USE THEREOF

(75) Inventors: David T. Dutton, San Jose, CA (US); Randall S. Urdahl, Mountain View, CA (US); Arthur Schleifer, Portola Valley, CA (US); Karen L. Seward, Palo Alto, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 483 days.

(21) Appl. No.: 11/485,063

(22) Filed: Jul. 11, 2006

(65) Prior Publication Data

US 2007/0170371 A1 Jul. 26, 2007

Related U.S. Application Data

(60) Provisional application No. 60/760,560, filed on Jan. 20, 2006.

(51) Int. Cl.
*H01J 49/00* (2006.01)
*H01J 27/00* (2006.01)

(52) U.S. Cl. .................................. 250/288; 250/423 R
(58) Field of Classification Search ................. 250/288, 250/423; 356/316; 315/111.11, 111.21, 315/111.51
See application file for complete search history.

(56) References Cited

U.S. PATENT DOCUMENTS

| | | | | |
|---|---|---|---|---|
| 3,624,389 | A * | 11/1971 | Cohen et al. | 250/288 |
| 4,479,075 | A * | 10/1984 | Elliott | 315/111.21 |
| 4,575,609 | A * | 3/1986 | Fassel et al. | 219/121.59 |
| 5,763,877 | A * | 6/1998 | Oishi et al. | 250/288 |
| 6,169,370 | B1 * | 1/2001 | Platzer | 315/111.21 |
| 6,900,734 | B2 * | 5/2005 | Duan | 340/632 |
| 6,917,165 | B2 | 7/2005 | Hopwood | |
| 7,091,481 | B2 * | 8/2006 | Miller et al. | 250/288 |
| 7,317,186 | B2 * | 1/2008 | Montaser et al. | 250/288 |
| 2004/0227938 | A1 * | 11/2004 | Craig | 356/318 |

OTHER PUBLICATIONS

Bilgic et al. "A New Low-Power Microwave Plasma Source Using Microstrip Technology for Atomic Emission Spectrometry," Plasma Sources Sci. Technol. (2000) 9:1-4.

Bilgic et al. A Low-Power 2.45 GHz Microwave Induced Helium Plasma Source at Atmospheric Pressure Based on Microstrip Technology, J. Anal. At. Spectrom. (2000) 15:579-580.

Iza et al. "Split-Ring Resonator Microplasma: Microwave Model, Plasma Impedance and Power Efficiency," Plasma Sources Sci. Technology (2005) 14:397-406.

Hopwood et al. "A Microfabricated Atmospheric-Pressure Microplasma Source Operating in Air," J. Phys. D: Appl. Phys. (2005) 38:1698-1703.

(Continued)

*Primary Examiner*—Jack I Berman
*Assistant Examiner*—Brooke Purinton (57) ABSTRACT

Aspects of the invention include sample ionizing devices and methods of use thereof. Embodiments of the sample ionizing devices include a microplasma generation source with a plasma generation region, a sample input port for delivering a sample to the plasma generation region, and a gas flow element configured to flow gas through the microplasma generation source independently of the sample input port. The devices and methods of the invention find use in a variety of different applications, including analyte detection applications.

22 Claims, 2 Drawing Sheets

OTHER PUBLICATIONS

Iza et al. "Rotational, Vibrational, and Excitation Temperatures of a Microwave-Frequency Microplasma," IEEE Transactions on Plasma Science (2004) 32(2):498-504.

Iza et al. "Low-Power Microwave Plasma Source Based on a Microstrip Split-Ring Resonator," IEEE Transactions on Plasma Science (2003) 31(4):782-787.

* cited by examiner

FIGURE 3D cross section of Figure 3A
through S

MICROPLASMA-BASED SAMPLE IONIZING DEVICE AND METHODS OF USE THEREOF

CROSS REFERENCE To RELATED APPLICATIONS

This application claims the benefit under 35 U.S.C. §119 (e) of prior U.S. provisional application Ser. No. 60/760,560 filed Jan. 20, 2006, the disclosure of which is incorporated herein by reference.

BACKGROUND

A plasma is an ionized gas, and is usually considered to be a distinct phase of matter. "Ionized" in this case means that at least one electron has been dissociated from a proportion of the atoms or molecules. The free electric charges make the plasma electrically conductive so that it couples strongly to electromagnetic fields. The term plasma is generally reserved for a system of charged particles large enough to behave as one. Even a partially ionized gas in which as little as 1% of the particles are ionized can have the characteristics of a plasma (i.e. respond to magnetic fields and be highly electrically conductive).

The use of larger atmospheric plasmas in chemical analysis is well established, with inductively coupled plasmas (ICP) and microwave cavities offering ionized sources for Optical Emission Spectroscopy (OES) or Mass Spectrometry (MS). In these established systems, input powers of greater than 1 kilowatt (KW) and gas flows of greater than 10 L/min are employed to maintain stable plasma conditions at atmospheric pressure. The gas flow is made up from a gaseous or aerosolized analyte and a make-up gas (e.g., He or Ar diluent). At such high flow rates, the make-up gas is the majority of the gaseous flow, with the analyte component often just a few mL/min. Hence large dilution factors are common which can adversely affect detection sensitivity.

Figure 1A:
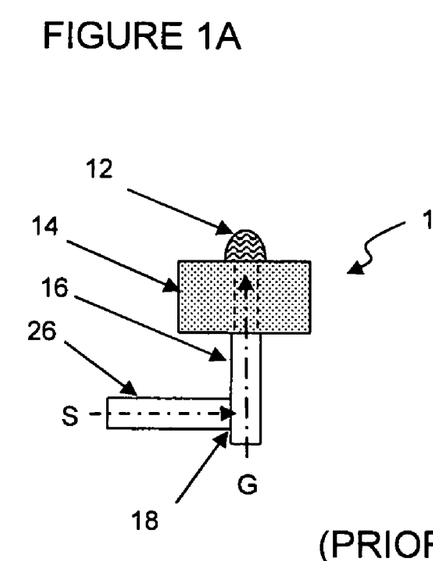
FIGS. 1A and 1B provide views of prior art sample ionization systems for use in analyte detection.
Figure 1B:
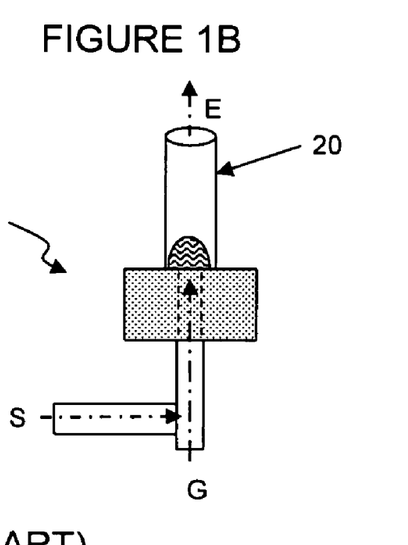

Reducing the size of the plasma to the microplasma regime (e.g., nL–μL volume) offers the opportunity to reduce both input power and gas flow rate. A review of microplasmas for chemical detection can be found in Karanassios, et al. (V2004 Microplasmas for Chemical Analysis: analytical tools or research toys. *Spectrochim Acta* B59:909-28). FIG. 1 (below) provides exemplary depictions of prior art microplasma devices.

FIG. 1A provides an exemplary depiction of a prior art microplasma device employed for analyte detection applications. In FIG. 1A, sample ionizing device 10 contains a plasma generation source 14, a sample feed 26, a gas feed 16, and a sample input port 18. In this device, the sample feed 26 directs the sample (e.g., gas containing analyte of interest) into the gas feed 16 (in direction of dotted arrow marked S) where it is diluted in the gas flowing in the gas feed 16 (in direction of dotted arrow marked G) and delivered to the plasma generation source 14 which produces a plasma plume 12 that contains ionized sample. The injection of a sample feed into a gas feed is similar to that of larger scale ICP torch systems. However, the macro size of these systems allows the sample feed to be run coaxially with the much larger diameter gas feed, instead of orthogonal as shown in this microplasma example. The plasma plume 12 exits the plasma generation source 14 into the air. Analytes ionized in the plasma may then be detected, e.g., by using optical emission spectroscopy, or mass spectrometry. Similar to the use of larger ICP torch devices summarized above, as the plume exits into the atmosphere it interacts with the surrounding air leading to contamination of the plasma because non-sample analytes from the atmosphere are ionized in the plasma. Increasing the power and gas flow rates can reduce the diffusion front of air (and its associated contaminants) with the main body of the plasma, but cannot eliminate it completely. Indeed, for large ICP torch systems the environment into which the torch emits needs to be controlled in order to bring chemical sensitivity down to the parts-per-trillion (ppt) level.

FIG. 1B demonstrates one prior art way to improve the functional parameters of microplasma-based sample ionizing devices. In this example, the plasma plume 12 is enclosed in a housing 20 such that the overpressure of the incoming gas flow prevents air diffusion into the small plasma volume (direction of the gas flow is indicated by dotted arrows G and E). Here again, however, moderate to high gas flow rates are required to prevent air diffusion (and thus contamination) from the top opening of the housing (also known as the exit port). While the length and diameter of the exit port can be altered to prevent back diffusion of air into the plasma and thus function with a lower flow rate (e.g., making the housing longer and narrower), this can produce high back pressures and long residence times in the plasma plume 12. If the plasma is used as a detection source for gas chromatography, for example, long residence times for the analyte will lead to trailing peaks in the chromatogram.

As such, there is continued interest in the development of new microplasma-based devices and systems, e.g., that can be employed for high sensitivity analyte detection.

SUMMARY

Aspects of the invention include sample ionizing devices and methods for using the same. Embodiments of the sample ionizing devices include a microplasma generation source with a plasma generation region, a sample input port for delivering a sample to the plasma generation region, and a gas flow element configured to flow gas through the microplasma generation source independently of the sample input port. Aspects of the methods include combining a carrier gas and a sample in the plasma generation region of the device. The devices and methods of the invention find use in a variety of different applications, including analyte detection applications.

The sample ionizing devices/analyte detection systems and methods of using the same of the invention may provide a number of benefits. Certain embodiments of the invention are characterized by the presence of a controlled local environment for the ionizing microplasma. Certain embodiments of the invention provide ionization of undiluted samples. These embodiments provide for higher sensitivity because the analyte(s) in the sample is ionized at its original concentration as it meets the plasma source (i.e., the sample is not diluted in the carrier gas flow before ionization, as in prior art devices). Embodiments of the invention are characterized by having short residence times and reduced tailing for gas chromatography due to the swift extraction of the analyte from the plasma source by the gas flow. In certain embodiments, the gas flow provides additional sample flow control to the plasma generating region by an induced Venturi effect, i.e., creating a negative pressure in the sample input port, which allows sample input flow from a static volume (e.g., either gas or liquid). Certain embodiments are characterized by having reduced cleaning requirements because the interior surface of gas flow element is exposed to the reactive plasma.

DETAILED DESCRIPTION

Aspects of the invention include sample ionizing devices and methods for using the same. Embodiments of the sample ionizing devices include a microplasma generation source with a plasma generation region, a sample input port for delivering a sample to the plasma generation region, and a gas flow element configured to flow gas through the microplasma generation source independently of the sample input port. Aspects of the methods include combining a carrier gas and a sample in the plasma generation region of the device. The devices and methods of the invention find use in a variety of different applications, including analyte detection applications.

Before the present invention is described in greater detail, it is to be understood that this invention is not limited to particular embodiments described, as such may vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range, is encompassed within the invention. The upper and lower limits of these smaller ranges may independently be included in the smaller ranges and are also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, representative illustrative methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present invention is not entitled to antedate such publication by virtue of prior invention. Further, the dates of publication provided may be different from the actual publication dates which may need to be independently confirmed.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation.

As will be apparent to those of skill in the art upon reading this disclosure, each of the individual embodiments described and illustrated herein has discrete components and features which may be readily separated from or combined with the features of any of the other several embodiments without departing from the scope or spirit of the present invention. Any recited method can be carried out in the order of events recited or in any other order which is logically possible.

Sample Ionizing Devices

As summarized above, the present invention provides sample ionizing devices. Aspects of the invention include embodiments in which a sample and a carrier gas are combined at a plasma generation region of a microplasma generation device in a manner sufficient to ionize the sample. In certain embodiments, the sample that is combined with the carrier gas in the microplasma generation region is an undiluted sample. By "undiluted sample" is meant that the sample is not combined with the carrier gas prior to, i.e., upstream of, the microplasma generation region. As such, sample and carrier gas are combined at the region of plasma generation, i.e., the location at which the plasma is struck from the carrier gas. As such, the subject devices are distinguished from the prior art devices depicted in FIGS. 1A and 1B, in which a sample is combined with the carrier gas at a location upstream of the plasma generation region of the plasma generation device.

Embodiments of the sample ionizing devices of the invention include: a microplasma generating source having a plasma generation region; a sample input port configured to introduce a sample into the plasma generation region; and a gas flow element configured to flow a carrier gas through the plasma generation region independently of the sample, such that the carrier gas and the sample enter the plasma generation region from different locations, i.e., independently of each other, and are therefore combined with each other in the plasma generation region of the device.

Figure 2A:
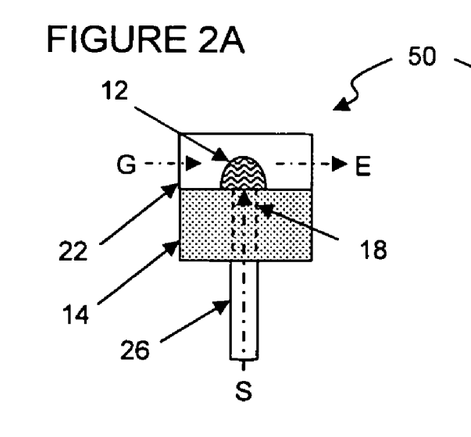
FIGS. 2A and 2B provide view of alternative embodiments of sample ionization devices of the invention.
Figure 2B:
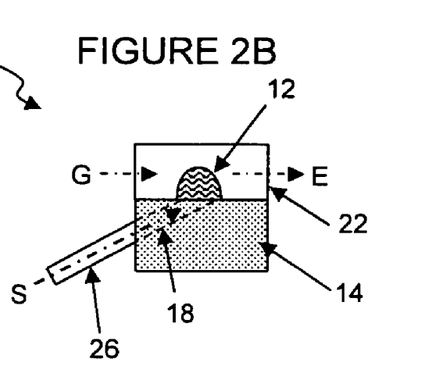

An embodiment of a sample ionizing device of the invention is depicted in FIGS. 2A and 2B. Sample ionizing device 50 includes the following components: a microplasma generating source 14 that produces a plasma volume in plasma generation region 12; a sample input port 18 that is configured to deliver a sample (e.g., containing or suspected of containing an analyte of interest) directly to the plasma generation region 12; and a gas flow element 22 configured to flow a carrier gas through the plasma generation region so that the sample and carrier gas are combined in the plasma generating region. Aspects of the invention include embodiments where the carrier gas flows through the plasma generating region in a direction that is substantially orthogonal to the sample input port. By orthogonal, it is meant that the gas flow is at a right angle (90°) (or substantially normal) to the plane of the sample input port. By "substantially orthogonal" is meant that the angle of the gas flow through the discharge gap is ±15°, such as ±10°, including ±5° of orthogonal. In the embodiment depicted in FIG. 1A, the carrier gas flows through the plasma generation region in a direction that is orthogonal to the sample input port (in the direction of the dotted arrows marked G and E).

The microplasma generating source of the device can be any of a variety of devices. Microplasma generating sources of interest include, but are not limited to: DC or pulsed DC micro-hollow-cathode plasma sources, dielectric barrier discharge (DBD) plasma sources, inductively coupled and capacitively coupled, Radio Frequency (RF) based microplasma sources and microwave microstrip resonator plasma sources, etc. Examples of microstrip resonator plasma sources include, but are not limited to, those described in U.S.

Pat. No. 6,917,165 issued to Hopwood et al.; U.S. patent application Ser. No. 11/485,051 and its priority U.S. provisional application Ser. No. 60/760,496; and copending U.S. patent application Ser. No. 11/485,222 and its priority U.S. provisional application Ser. No. 60/760,872; the disclosures of which are herein incorporated by reference for there descriptions of microwave resonator plasma generating devices). As described therein, these resonators produce microplasma plumes in a flowing gas environment (i.e., with gas flowing through the discharge gap of the microstrip resonant ring) as opposed to a static-gas environment. These particular embodiments will be described in further detail below.

The sample input port of the subject devices is configured to deliver a sample to the plasma generation region of the microplasma generating source. The sample. input port can deliver the sample to the plasma generating region and plasma present therein from virtually any direction. As such, the specific configuration of the sample input port will be determined primarily by the structural considerations and the intended use of the of the sample ionizing device. In certain embodiments, the sample input port is integral to the substrate from which the microplasma generating source is fabricated. For example, the sample input port may be etched, molded, or drilled directly onto/into the substrate. In these embodiments, the sample input port can take a variety of configurations, including a passage, channel, aperture, groove, etc. For example, in FIG. 2A the sample input port 18 as depicted is a channel that is drilled through the substrate and configured such that a sample drawn through it (from sample feed 26) emerges at a point that is within the plasma generation region 12 of the plasma generating source 14 (e.g., so that it emerges in the plasma volume which is maintained by the gas feed and the microplasma generating source). In certain other embodiments, the sample input port is a separate element, e.g., line feed, which is stably attached, e.g., affixed, to the structure in a manner sufficient to provide for the desired sample delivery during use. The sample input port may be fabricated from the same material as or a different material than the materials from which the other components of the device are fabricated, e.g., the substrate.

In certain embodiments, the sample ionizing device contains a sample feed connector (not shown) coupled to the sample input port. The sample feed connector is configured to attach a sample feed line to the sample input port and may include a number of different components, e.g., connector elements, such as nozzles, lips, threads, gaskets, etc., made from a variety of different materials, e.g., metal, rubber, silicone, etc. The sample feed connector can be disposed in any convenient location on the sample ionizing device. For example, in certain embodiments, the sample feed connector is disposed on the substrate of the microplasma generating source. In certain other embodiments, the sample feed connector may be detached from the substrate of the microplasma generating source. The configuration of the connector will depend, at least in part, on the nature of the sample input port being employed.

As indicated above, the sample ionizing device of the present invention contains a gas flow element configured to flow a gaseous stream of a carrier gas through the plasma generation region. The flow of carrier gas delivered by the gas flow element can be in a variety of directions relative to the plasma generation region. In certain embodiments, the gas flow element flows gas in a direction that is substantially orthogonal, and in certain embodiments orthogonal, to the sample input port (e.g., as depicted in FIG. 2A). As reviewed above, by orthogonal to the sample input port is meant that the gas flows through the plasma generation region at a right angle (90°) (or substantially normal) to the direction of flow of sample entering the plasma generation region (e.g., at a 90° angle to dotted line S in FIG. 2A). By "substantially orthogonal" is meant that the angle of the gas flow through the plasma generation region is ±15°, such as ±10°, including ±5° of orthogonal as described above. For example, in the embodiment shown in FIG. 2A, gas flow element 22 is a channel that overlays (or covers) the plasma generation region 12 of the plasma generation source 14 which flows gas in a direction depicted by dotted arrow G, which is orthogonal to sample input port 18 (where the sample is delivered in a direction indicated by dotted line S).

In certain other embodiments, the gas flow element and sample input port are not disposed such that the gas flow is orthogonal to the sample input port. For example, FIG. 2B depicts an embodiment of the invention in which the sample input port 18 delivers sample from the side of the microplasma generating source 14 to the microplasma generation region 12 (or plasma volume). In this embodiment, the gas flow (indicated by dotted line G) through gas flow element 22 is not orthogonal to the sample input port. In certain embodiments, the sample input port runs coaxially with the gas flow element.

The gas flow element can be configured in a variety of ways. In certain embodiments, the gas flow element is integral to the substrate of the plasma generating source. For example, the gas flow element may be etched, molded, or drilled directly onto/into the substrate. In certain other embodiments, the gas flow element is a separate element that is stably attached, e.g., affixed, to the structure in a manner sufficient to provide for the desired gas flow through the plasma generation region during use. The gas flow element may be fabricated from the same material as or a different material than the materials from which the other components of the device are fabricated, e.g., the substrate of the microplasma generation source. In addition, the gas flow element can be fabricated from multiple different materials. In certain embodiments, the gas flow element is fabricated from or contains a material that is optically transparent, as in when the device is used in analyte detection systems (described in detail below).

The structure and dimensions of the gas flow element may vary widely depending on a number of variables (e.g., the desired gas flow rate, the sample delivery rate, the intended use of the device, desired size of the plasma, etc.). In certain embodiments, the gas flow element is dimensioned to provide for a flow of carrier gas have a rate that ranges from about 1 to about 1000 ml/min, such as from about 2 to about 100 ml/min, including from about 10 to about 50 ml/min. In certain embodiments, the gas flow element has a cross section that is circular, square, rectangular or a combination thereof, having a cross sectional area from about $1 \times 10^{-10} m^2$ (10 um square, e.g. a 2 um×5 um rectangle) to about $1 \times 10^{-4} m^2$ (10 mm square, e.g. a 2 mm×5 mm rectangle), such as from about $5 \times 10^{-9} m^2$ (50 um square) to about $1 \times 10^{-6} m^2$ (1 mm square) and including from about $1 \times 10^{-8} m^2$ (100 um square) to about $5 \times 10^{-8} m^2$ (500 um square).

In certain embodiments, the plasma generating device contains a gas feed connector (not shown) coupled to the gas flow element. The gas feed connector is configured to attach a gas feed line to the gas flow element, and may include a number of different components, e.g., nozzles, lips, threads, gaskets, barbed fittings etc., made from a variety of different materials, e.g. metal, rubber, silicone, etc. The gas feed connector can be disposed in any convenient location on the sample ionizing device. For example, in certain embodiments, the gas feed connector for the gas flow element is disposed on the substrate of the microplasma generation source. In certain other embodiments, the gas feed connector may be detached from the substrate. The configuration of the connector will depend, at least in part, on the nature of the gas flow element being employed.

Depending upon carrier gas flow and plasma conditions for the microplasma generation source, in certain embodiments the carrier gas flow in the gas flow element may be completely ionized (i.e., all the carrier gas in the gas flow element is in the form of a plasma in the plasma generation region). In other words, the microplasma generation region of the plasma generation source is the entire volume of the gas flow element. In these embodiments, the system can be seen as sample mixed with a sheet plasma flow.

The fluid flow interaction between the sample and the gas flow (also called sheet flow) can be tailored by the dimensions of the sample input port and sheet flow cross sections. Large area sheet flows (compared to the sample input) may be employed to produce a negative pressure, a Venturi effect, at the sample input port that can be used to draw a sample through the sample input port (sample line feed) from a static volume, or to assist the output of a sample from another device (e.g., a gas chromatography (GC) column). In certain of these embodiments, the area of the sheet flow exceeds the area of the sample input by about 625 fold or more (e.g., 20 um square feeding 500 um square), such as by about 2500 fold or more (e.g., 20 um square feeding 1 mm square), and including by about 250,000 fold or more (e.g., 20 um square feeding 10 mm square). In certain embodiments, a liquid can be drawn up through the sample input port, where the "liquid to plasma-phase" transition rate is balanced with this negative flow rate. As such, the subject sample ionizing devices can be used for ionizing both gaseous and liquid samples.

Figure 3A:
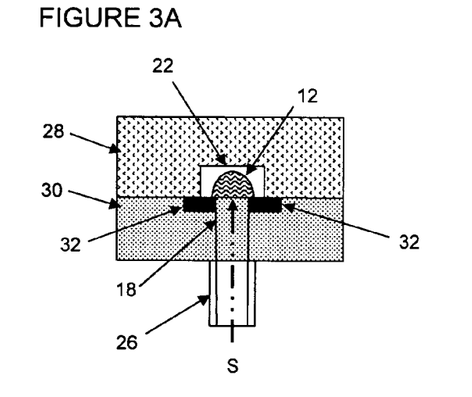
FIGS. 3A to 3D provide embodiments of the sample ionization devices of the invention having a substrate and an optically transparent top plate.
Figure 3B:
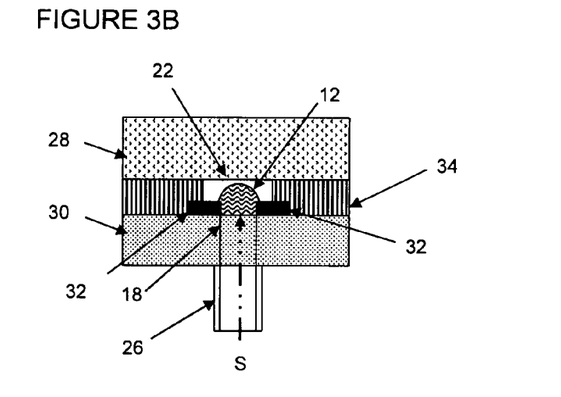
Figure 3C:
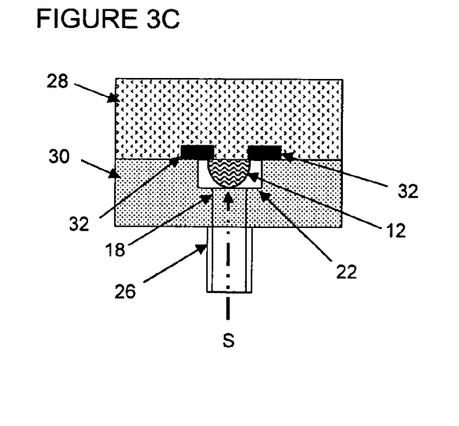
Figure 3D:
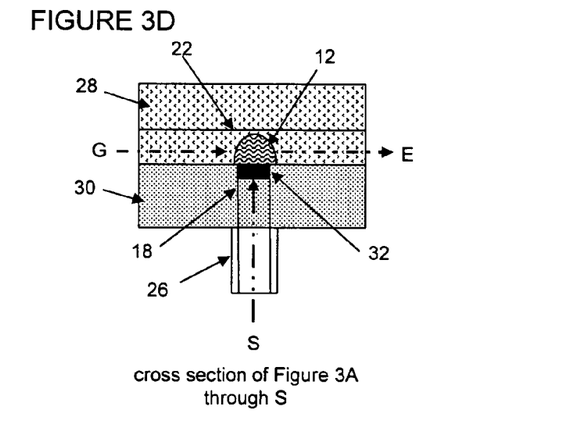

Further embodiments of the sample ionizing devices of the invention are shown in FIGS. 3A to 3D. FIG. 3A depicts a sample ionizing device with a microplasma generating source (having a ceramic substrate 30 and metal contacts 32 for microplasma discharge) and an optically transparent material 28 (e.g., glass or quartz) forming the gas flow element 22. As with the generalized device shown in FIG. 2A, the gas flow element 22 overlays the plasma generation region 12 (depicted as a plasma plume) of the plasma generation source and sample input port 18 delivers a sample directly to the microplasma generation region 12 (the sample travels as indicated by dotted line S). FIG. 3B depicts an embodiment similar to FIG. 3A except that an intermediate glass layer 34 forms the sides of gas flow element 22. While the metal contacts 32 in FIG. 3B occupy the intermediate glass layer 34, in certain other embodiments the metal contacts remain in the ceramic substrate 30 (as in FIG. 3A). FIG. 3C depicts an additional embodiment in which the gas flow element 22 is present in the ceramic substrate 30 rather than the optically transparent material 28. Again, the position of the metal contacts in this embodiment may vary, provided that the plasma generation region is positioned appropriately with regard to the sample input port (i.e., the sample input port delivers a sample directly to the location of the strongest electric or magnetic field). For example, the metal contacts may reside in the ceramic substrate 30 (as in FIG. 3A). FIG. 3D provides a cross sectional view of the device depicted in FIG. 3A through dotted line S.

In the embodiments depicted in FIGS. 3A to 3D, the optically transparent material 28 allows light generated at the plasma volume (e.g., from ionized gases and/or an ionized analyte) to be detected (e.g., by OES). However, because the devices of the invention can be used in any number of different applications, there is no requirement that the plasma volume be optically accessible. For example, by incorporation of field focusing electrodes in the gas flow element, ions can be extracted from the plasma volume for ion current detection (via electrometer), for mass spectrometry or for ion mobility spectrometry.

The above description of sample ionizer devices according to various embodiments of the invention is provided for illustrative purposes only and is not meant to be limiting.

Systems

Also provided by the subject invention are systems that include the sample ionization devices, e.g., as described above. Aspects of these system embodiments of the invention include systems having a sample ionizing device as described above, a gas source for providing a carrier gas to the device and a sample source for providing sample to the device, e.g., as described above.

In certain embodiments, the systems may further include a detector, e.g., for detecting analyte in an ionized sample. The detector may vary depending on the particular application for which the system is designed. Detectors of interest include detectors configured for detecting ionized species, e.g., analytes, in a plasma. Specific types of detectors of interest include, but are not limited to: optical spectrometers, mass spectrometers, ion mobility spectrometers, and electrometers etc. In certain embodiments, the detector is configured within the system to interrogate a spatially defined volume in the plasma generation region of the device, using UV-visible optics or ion-optics dependent upon whether collecting photons or ions.

In certain embodiments, the plasma producing system of the invention contains a sample feed for delivering a sample to the plasma. In certain embodiments, a system of the invention contains a gas feed connector configured to connect a gas feed line, e.g., from a carrier gas source, to the gas flow element.

In certain embodiments, the system further contains a power source that supplies power to the plasma generation source in a manner sufficient to generate a plasma at the plasma generation region of the device. The power supply is connected to the device using any convenient coupling element. In certain embodiments, the power supply is of such a small size and compact construction such that it is integrated into associated equipment, e.g., so that it is easily transportable for field use or for other portable applications. In certain embodiments, the power source is an integrated circuit power amplifier.

In certain embodiments, the sample ionization devices are a component of an analytical system. The term "analytical system" is used broadly to refer to any type of system that performs an analysis of a sample. In certain embodiments, the analytic system is an analytical chemistry system, which is a system that analyzes samples to gain an understanding of their chemical composition. Of interest in certain embodiments are chromatographic devices, including both liquid and gas chromatographic devices, optical emission spectroscopy devices, mass spectrometry devices, etc.

Methods

Aspects of the invention also include methods of ionizing a sample. Aspects of the methods include: striking a plasma in a plasma generation region of a plasma generation source; and delivering the sample to the plasma generation region via a sample input port in a manner sufficient to produce ionized sample. In certain embodiments, a carrier gas is flowed through the plasma generation region via a gas flow element. In certain embodiments, the carrier gas is flowed through the region in a manner that removes the ionized sample from the plasma generation region following ionized sample production. In certain of these embodiments, a sample ionizing device as described above is employed.

In the methods of the invention, the rate of flow of a sample entering the plasma generation region ranges from about 0.1 to about 1000 ml/min, such as from about 1 to about 100 ml/min, and including from about 1 to about 10 ml/min. In certain embodiments of the methods of the invention, the rate of carrier gas flow through the plasma generation region ranges from about 1 to about 1000 ml/min, such as from about 1 to about 100 ml/min, and including from about 1 to about 10 ml/min. The rate of gas flow through the plasma generation region is determined, in certain embodiments, based on the specific purpose of the method and the nature of the gas flowing through the plasma generation region. In certain embodiments, the gasses of interest include, but are not limited to, inert gasses, e.g., argon, helium, xenon, etc. In certain embodiments, the sample flow rate and the gas flow rate are chosen to at least enhance sample flow from a sample source through the sample inlet port into the plasma generation region, e.g., where the sample is drawn into the plasma generation region by the negative pressure at the sample input port produce by the flow of carrier gas relative to the sample inlet port, e.g., orthogonal to the sample inlet port, as described above.

The sample that is delivered to the plasma generation region of the sample ionizing device can be in a variety of states, including gas or liquid. In certain embodiments the sample is an aerosolized sample in a solvent. In certain embodiments, the sample is delivered directly to the plasma generation region of the sample ionizing device, and as such is ionized in an undiluted state.

Certain embodiments of the methods of the invention are drawn to analyte detection, e.g., using the systems of the invention as described above. These embodiments include the steps of: flowing a carrier gas via a gas flow element through the plasma generation region of a microplasma generating source; striking a microplasma in the plasma generation region; and delivering an analyte-containing sample via a sample input port to the plasma generation region, where the microplasma ionizes the sample and any analyte therein; and detecting the ionized analyte.

In certain of these embodiments, the analyte-containing sample delivered to the plasma generation region is preprocessed, whereas in other of these embodiments, it is not preprocessed. For example, in certain of these embodiments, the analyte-containing sample delivered to the plasma generation region is un-fractionated, whereas in other of these embodiments, it is fractionated. In these embodiments, a sample can be fractionated using any convenient fractionation protocol, such as a chromatographic protocol, e.g., a gas chromatographic protocol, a liquid chromatographic protocol, etc., where the resultant fractionated sample is then sent via the sample input port to the plasma generation region.

Regardless of whether the analyte-containing sample is preprocessed, as it enters the plasma generation region in which a plasma is present, it is ionized. In certain embodiments, the ionized sample is analyzed and the ionized sample constituents (or ionized analytes), or a least a portion thereof, are analyzed. In certain embodiments, an ionized constituent (s) of the sample is detected by a detector configured to interrogate an ionized sample in a spatially defined volume, e.g., using optical emission spectroscopy (OES), ion current, mass spectrometry or ion mobility spectrometry. This volume can be in any of a number of locations, including within the plasma generation region.

In certain embodiments, the ionized sample is detected essentially as it is produced, e.g., such as occurs in embodiments where the detector is configured to analyze the ionized sample while within the plasma generation region of the sample generation device. In these embodiments, the ionized sample is removed from the plasma generation region by the gas carrier gas flow. In certain other embodiments, the ionized sample is analyzed outside of the plasma generation region of the sample ionizing device. In certain of these embodiments, the sample is ionized, removed from the plasma generation region by the flow of the carrier gas through the plasma generation region and any electric field set up by high voltage electrodes (ion optics), and then analyzed, e.g., using an electrometer, mass spectrometer or ion mobility spectrometer.

Regardless of when the analysis of the ionized sample takes place, the methods of the invention provide for a substantially continuous process of sample ionization and analysis until the entire sample of interest (or desired portion thereof) has been analyzed.

As discussed above, certain embodiments of the subject methods of the invention provide for the ionization and analysis of samples that are not diluted by carrier gas flow. In these embodiments, the sample and carrier gas are enter the plasma generating region of the sample ionizing device independently, i.e., from independent sample input and gas flow elements. In this way, certain embodiments of the invention provide for methods of sample analysis that have an increased sensitivity over methods in which the sample and carrier gas are mixed together prior to entering the plasma generating region of a sample ionizing device.

Utility

The invention finds use in methods of sample analysis, where a sample may be any material, e.g., liquid or gas, (including solubilized or dissolved solids) or mixture of materials, which may be dissolved in a solvent. Samples may contain one or more components/analytes of interest. Samples may be derived from a variety of sources such as from foodstuffs, environmental sources (e.g., water, soil, air, etc.), a biological sample such as tissue or fluid isolated from a subject (e.g., a plant or animal subject), including but not limited to, for example, plasma, serum, spinal fluid, semen, lymph fluid, the external sections of the skin, respiratory, intestinal, and genitourinary tracts, tears, saliva, milk, blood cells, tumors, organs, and also samples of in vitro cell culture constituents (including but not limited to conditioned medium resulting from the growth of cells in cell culture medium, putatively virally infected cells, recombinant cells, and cell components), or any biochemical fraction thereof. Also included by the term "sample" are samples containing calibration standards or reference standards (e.g., molecular mass standards, known molecules/analytes, etc.).

Kits

Kits for retrofitting an analytical system to include sample ionization of the subject invention are also provided. Certain embodiments of kits of the invention are characterized by having any of the compositions described above, including a sample ionization device. The kit may also contain instructions for installing the sample ionization device.

Instructions for practicing the methods are generally recorded on a suitable recording medium. For example, the instructions may be printed on a substrate, such as paper or plastic, etc. As such, the instructions may be present in the kits as a package insert, in the labeling of the container of the kit or components thereof (i.e., associated with the packaging or sub-packaging) etc. In other embodiments, the instructions are present as an electronic storage data file present on a suitable computer readable storage medium, e.g. CD-ROM, diskette, etc. In yet other embodiments, the actual instructions are not present in the kit, but means for obtaining the instructions from a remote source, e.g. via the internet, are provided. An example of this embodiment is a kit that includes a web address where the instructions can be viewed and/or from which the instructions can be downloaded. As with the instructions, this means for obtaining the instructions is recorded on a suitable substrate.

The above described sample ionizing devices/analyte detection systems and methods of using the same provide a number of benefits. Certain embodiments of the invention are characterized by the presence of a controlled local environment for the ionizing microplasma. Certain embodiments of the invention provide ionization of undiluted samples. These embodiments provide for higher sensitivity because the analyte(s) in the sample is ionized at its original concentration as it meets the plasma source (i.e., the sample is not diluted in the carrier gas flow before ionization, as in prior art devices). Embodiments of the invention are characterized by having short residence times and reduced tailing for gas chromatography due to the swift extraction of the analyte from the plasma source by the gas flow. In certain embodiments, the gas flow provides additional sample flow control to the plasma generating region by an induced Venturi effect, i.e., creating a negative pressure in the sample input port, which allows sample input flow from a static volume (e.g., either gas or liquid). Certain embodiments are characterized by having reduced cleaning requirements because the interior surface of gas flow element is exposed to the reactive plasma.

Although the foregoing invention has been described in some detail by way of illustration and example for purposes of clarity of understanding, it is readily apparent to those of ordinary skill in the art in light of the teachings of this invention that certain changes and modifications may be made thereto without departing from the spirit or scope of the appended claims.

Accordingly, the preceding merely illustrates the principles of the invention. It will be appreciated that those skilled in the art will be able to devise various arrangements which, although not explicitly described or shown herein, embody the principles of the invention and are included within its spirit and scope. Furthermore, all examples and conditional language recited herein are principally intended to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention as well as specific examples thereof, are intended to encompass both structural and functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary embodiments shown and described herein. Rather, the scope and spirit of the present invention is embodied by the appended claims.

What is claimed is:

1. A sample ionizing device comprising:
a plasma generating source having a plasma generation region;
a sample input port configured to deliver a sample directly to said plasma generation region; and
a gas flow element comprising a channel configured to flow a carrier gas through said plasma generation region,
wherein said sample and said carrier gas are combined at said plasma generation region and wherein said channel physically encloses said plasma generation region such that said plasma generation region resides within said gas flow element.

2. The sample ionizing device of claim 1, wherein said plasma generating source is selected from the group consisting of: a DC or pulsed DC micro-hollow-cathode plasma sources, dielectric barrier discharge (DBD) plasma sources, inductively coupled and capacitively coupled Radio Frequency (RF) based microplasma sources, and microwave microstrip resonator plasma sources.

3. The sample ionizing device of claim 1, wherein said gas flow element flows said carrier gas through said plasma generation region in a direction that is substantially orthogonal to the direction of flow of said sample entering said plasma generation region.

4. The sample ionizing device of claim 1, further comprising a gas feed connector configured to connect a gas feed line to said gas flow element.

5. The sample ionizing device of claim 1, further comprising a sample feed connector configured to connect a sample feed line to said sample input port.

6. An analyte detection system comprising:
a) a sample ionizing device comprising:
  i) a plasma generating source having a plasma generation region;
  ii) a sample input port configured to deliver an analyte-containing sample directly to said plasma generation region; and
  iii) a gas flow element comprising a channel configured to flow a carrier gas through said plasma generation region,
  wherein said sample and said carrier gas are combined at said plasma generation region and wherein said channel physically encloses said plasma generation region such that said plasma generation region resides within said gas flow element;
b) a carrier gas source; and
c) a sample source.

7. The analyte detection system of claim 6, wherein said plasma generating source is selected from the group consisting of: DC or pulsed DC micro-hollow-cathode plasma sources, dielectric barrier discharge (DBD) plasma sources, inductively coupled and capacitively coupled Radio Frequency (RF) based microplasma sources, and microwave microstrip resonator plasma sources.

8. The analyte detection system of claim 6, wherein said gas flow element flows said carrier gas through said plasma generation region in a direction that is substantially orthogonal to the direction of flow of said sample entering said plasma generation region.

9. The analyte detection system of claim 6, further comprising a gas feed connector configured to connect a gas feed line to said gas flow element.

10. The analyte detection system of claim 6, further comprising a sample feed connector configured to connect a sample feed line to said sample input port.

11. The analyte detection system of claim 6, wherein said system further comprises a detector.

12. The analyte detection system of claim 11, wherein said detector is selected from the group consisting of: mass spectrometry (MS), ion current measurement, ion mobility spectrometry (IMS), and optical emission spectroscopy (OES).

13. The analyte detection system of claim 11, wherein said detector is configured to interrogate a spatially defined volume in said plasma generation region for photons or ions.

14. A method of ionizing a sample comprising:
   a) flowing a carrier gas through a plasma generation region of a plasma generating source via a gas flow element, wherein said gas flow element comprises a channel configured to flow said carrier gas through said plasma generation region, wherein said channel physically encloses said plasma generation region such that said plasma generation region resides within said gas flow element;
   b) striking a plasma in said plasma generation region
   c) delivering a sample to said plasma generation region via a sample input port configured to deliver said sample directly to said plasma generation region,
   wherein said sample and said carrier gas are combined at said plasma generation region.

15. The method of claim 14, wherein said gas flow element flows said carrier gas through said plasma generation region in a direction that is substantially orthogonal to the direction of flow of said sample entering said plasma generation region.

16. The method of claim 14, wherein said sample is delivered to said plasma generation region at a rate ranging from about 1 to about 100 ml/min.

17. The method of claim 14, wherein said sample is a liquid.

18. The method of claim 14, wherein said sample is a gas.

19. A method of detecting an analyte in a sample, said method comprising:
   a) flowing a carrier gas through a plasma generation region of a plasma generating source via a gas flow element;
   b) striking a plasma in said plasma generation region;
   c) delivering a sample via a sample input port configured to deliver a sample directly to said plasma generation region so that said sample is ionized,
   wherein said sample and said carrier gas are combined at said plasma generation region and wherein said gas flow element comprises a channel configured to flow said carrier gas through said plasma generation region, wherein said channel physically encloses said plasma generation region such that said plasma generation region resides within said gas flow element; and
   d) assessing said ionized sample for the presence of said analyte.

20. The method of claim 19, wherein said gas flow element flows said carrier gas through said plasma generation region is in a direction that is substantially orthogonal the direction of flow of said sample entering said plasma generation region.

21. The method of claim 19, wherein said sample is pre-processed.

22. The method of claim 19, wherein said ionized sample is assessed by a detector configured to interrogate a spatially defined volume in said plasma generation region for photons or ions.

* * * * *

UNITED STATES PATENT AND TRADEMARK OFFICE
CERTIFICATE OF CORRECTION

| | | |
|---|---|---|
| PATENT NO. | : 7,812,307 B2 | Page 1 of 1 |
| APPLICATION NO. | : 11/485063 | |
| DATED | : October 12, 2010 | |
| INVENTOR(S) | : David T. Dutton et al. | |

It is certified that error appears in the above-identified patent and that said Letters Patent is hereby corrected as shown below:

In column 13, line 25, in Claim 16, delete "100 ml/min." and insert -- 100ml/min. --, therefor.

Signed and Sealed this
Twenty-fifth Day of January, 2011

David J. Kappos
*Director of the United States Patent and Trademark Office*